United States Patent [19]

Class et al.

[11] 4,198,283
[45] Apr. 15, 1980

[54] MAGNETRON SPUTTERING TARGET AND CATHODE ASSEMBLY

[75] Inventors: Walter H. Class, Yonkers; George J. Unterkofler, Nanuet, both of N.Y.; Steven D. Hurwitt, Park Ridge, N.J.

[73] Assignee: Materials Research Corporation, Orangeburg, N.Y.

[21] Appl. No.: 957,698

[22] Filed: Nov. 6, 1978

[51] Int. Cl.$^2$ .............................................. C23C 15/00
[52] U.S. Cl. .................................. 204/298; 204/192 R
[58] Field of Search ................ 204/192 R, 192 C, 298

[56] References Cited

U.S. PATENT DOCUMENTS

| 4,100,055 | 7/1978 | Rainey | 204/298 |
| 4,116,806 | 9/1978 | Love et al. | 204/298 |

*Primary Examiner*—Aaron Weisstuch
*Attorney, Agent, or Firm*—Kenyon & Kenyon

[57] ABSTRACT

A magnetron cathode assembly for use in a cathode sputtering apparatus includes a support means for a rectangular frame-like annular target and spaced apart inner and outer pole pieces fastened to the support member and providing a rectangular annular channel for mounting the target in electrically and thermally conductive contact with the support means. Preferably, the target is a set of four straight bars shaped at the ends to assemble together as a rectangular frame. Target bars having a symmetrical hourglass cross section with overhanging flanged side portions adjacent to front and rear faces are adapted to be reversibly clamped to the support means by the inner and outer poles for simple and rapid replacement in the field, said hourglass shape providing maximum utilization of target material.

26 Claims, 13 Drawing Figures

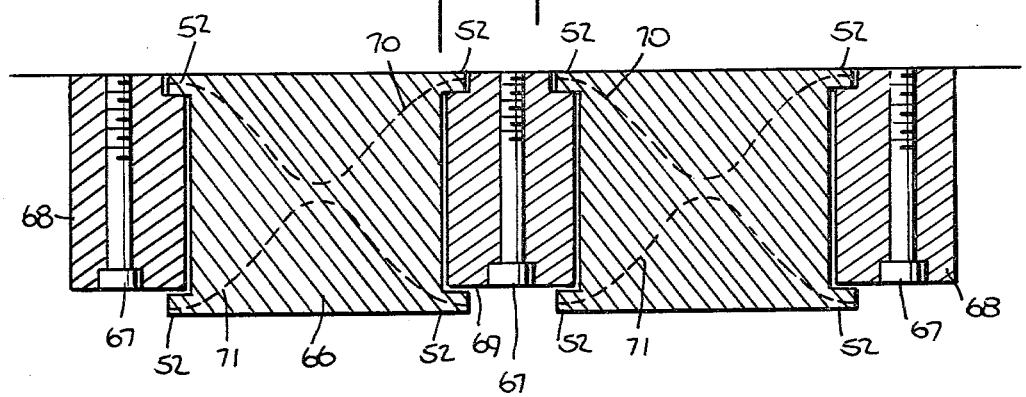
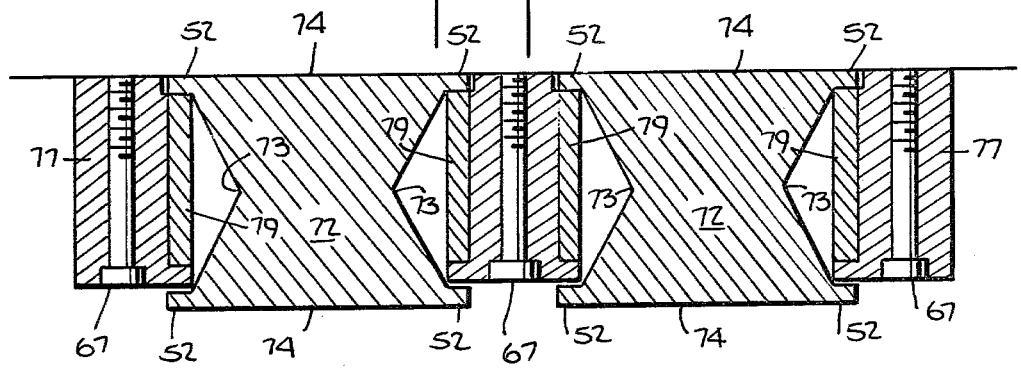
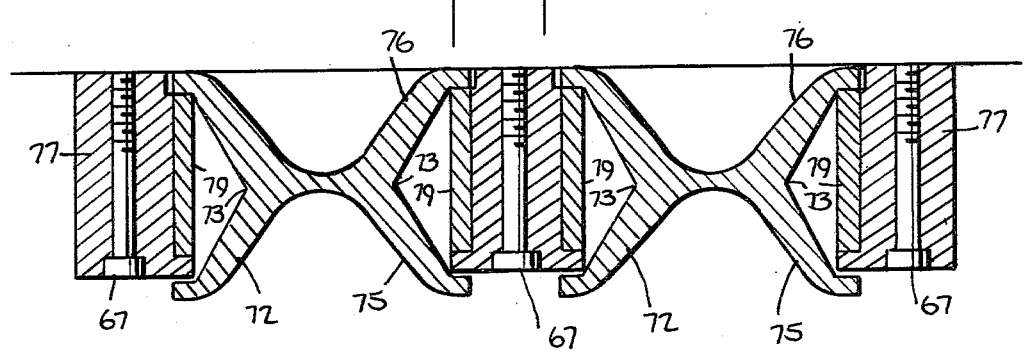

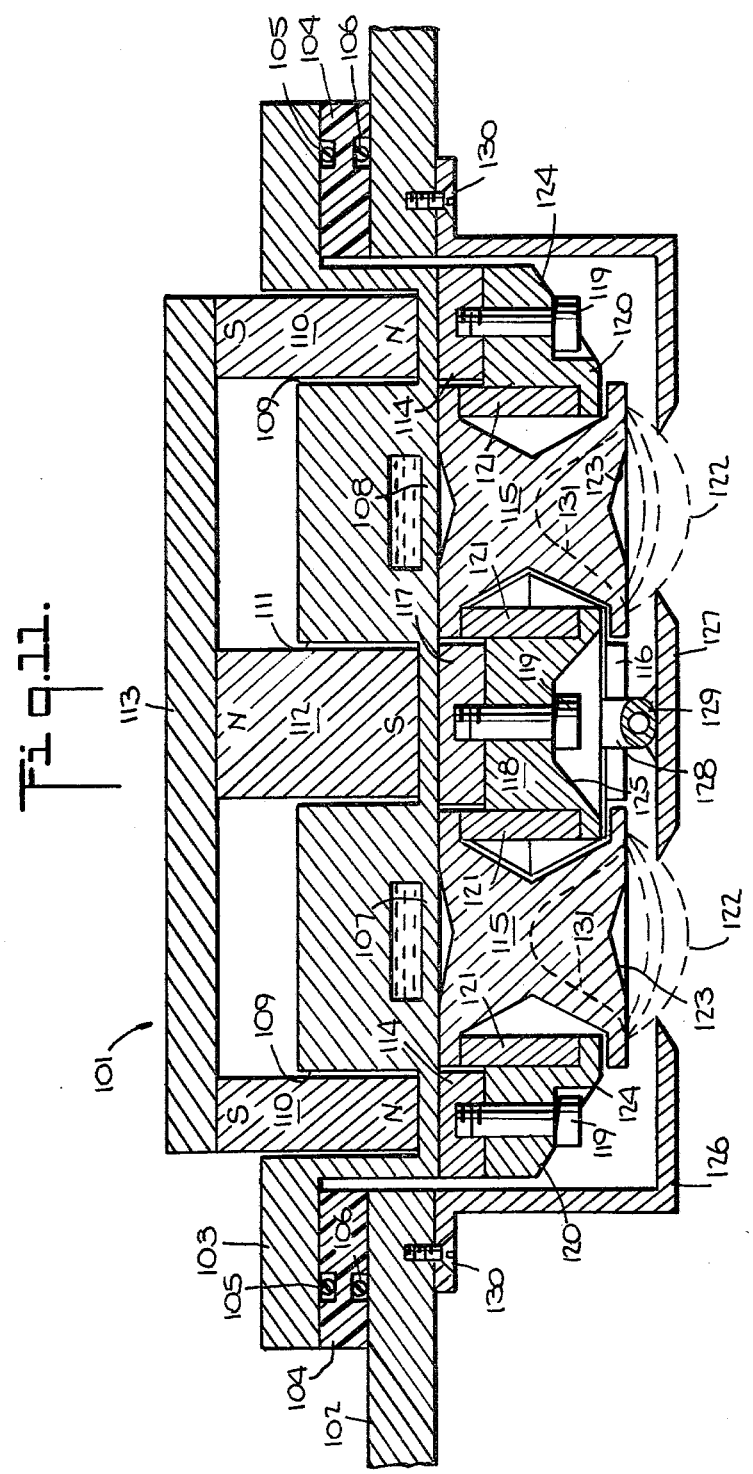

MAGNETRON SPUTTERING TARGET AND CATHODE ASSEMBLY

This invention relates to apparatus for cathode sputtering and particularly to an improved target and a cathode assembly incorporating the target for use in a magnetron sputtering system.

Cathode sputtering is widely used for depositing thin films of material onto substrates. The process involves vaporizing a material by ion bombardment of a target composed of the material, the target forming part of a cathode assembly in an evacuated chamber containing an inert gas such as argon. A high voltage electric field is applied between the cathode assembly and an anode in the chamber, and the gas is ionized by collision with electrons ejected from the surface of the cathode. The positive gas ions are attracted to the cathode surface, and particles of material dislodged when the ions strike the target then traverse the enclosure and deposit as a thin film onto a substrate or substrates positioned on a support maintained at or near anode potential.

Although the sputtering process can be carried out solely in an electric field, substantially increased deposition rates are possible with magnetron sputtering, in which an arched magnetic field, formed in a closed loop over the surface of the sputtering target, is superimposed on the electric field. The arched closed-loop magnetic field traps electrons in an annular region adjacent to the surface of the target, thereby multiplying the collisions between electrons and gas atoms to produce a corresponding increase in the number of ions in that region.

The development of magnetron sputtering can be traced from U.S. Pat. No. 2,146,025 issued to F. M. Penning on Feb. 7, 1939. The theory of magnetron sputtering was further developed by researches of E. Kay et al., as exemplified by U.S. Pat. No. 3,282,816 issued on Nov. 1, 1966 and U.S. Pat. No. 3,325,394 issued on June 13, 1967. A. S. Penfold et al. stress the importance of trapping electrons between the target surface and a re-entrant magnetic field and disclose a number of target shapes, including cylindrical, double-conical, and flat, with corresponding magnet configurations to produce such completely closed plasma traps in U.S. Pat. No. 4,041,353 issued on Aug. 9, 1977. A similarly closed plasma trap for a hollow hemispherical target is described by J. R. Mullaly in an article appearing in Research/Development for February 1971, pages 40-44. U.S. Pat. No. 3,878,085, issued to J. F. Corbani on Apr. 15, 1975, gives a particularly cogent analysis of the practical aspects of magnetron sputtering from both ring-shaped and elongated oval targets, and another magnetron cathode assembly using a rectangular planar target is described by J. S. Chapin in Canadian Pat. No. 1,014,519 issued on July 26, 1977.

To take fullest advantage of the high deposition rates possible with magnetron cathode sputtering, high-production systems have been developed in which the substrates are transported on intermittently or continuously moving supports along a linear path underneath a magnetron cathode assembly having an elongated substantially planar target, the longitudinal axis of the target being transverse to the direction of substrate movement.

In the conventional planar target cathode assembly, a flat target plate composed of the material which is to be deposited onto the substrates is attached to a nonmagnetic support means or backing plate to form a cathode assembly. The backing plate is usually water-cooled to carry away the heat that is generated by ion bombardment of the target. Magnet means, either electromagnets or permanent magnets, are arranged for producing a re-entrant arched magnetic field in the form of a closed loop or tunnel extending from the exposed face of the target. In a typical arrangement, the closed-loop field is created by an annular magnetic pole of one sign adjacent to the edge of the target support plate and a bar-shaped pole of the opposite sign extending along the center line of the support, both magnetic poles being located behind the target and its support means.

To achieve good thermal and electrical contact, the flat target plate is normally attached to the support means by some form of bonding material such as soft solder, hard solder, low-temperature solder (e.g., indium), or a special conductive epoxy cement. This method of attachment presents a number of problems. For one thing, it is difficult to obtain a good bond that is physically strong and contains no large areas of entrained foreign materials, such as flux or gases, which could be drawn out under the evacuated conditions of sputtering operation and contaminate the deposited layer. Another drawback is that since bonding of the target to the support plate requires considerable skill, the entire cathode assembly must be returned to the vendor for replacement of the target. In addition to the cost for this service, the user must maintain an expensive inventory of cathode assemblies to avoid down time of the sputtering system.

The bonding and associated replacement problems described above are eliminated in one available target design sold by Varian Associates under the trademark "S-Gun." The Varian target is circular and is held in a mating cup-shaped copper mounting fixture by friction. The required close fit demands narrow manufacturing tolerances for the diameters of the target and fixture. Such close tolerances are relatively easy to achieve with circular surfaces but are substantially more expensive to obtain with non-circular shapes. As pointed out earlier, however, it is desirable to have an elongated target shape for high-production systems, so that the substrate supports can be moved through the sputtering chamber along a line transverse to the longitudinal axis of the target.

Another drawback of the conventional flat plate target is that erosion occurs in a relatively narrow ring-shaped region corresponding to the shape of the closed-loop magnetic field. The reason for this is that since the path of an electron leaving the target is approximately perpendicular to the surface, it is only the component of the arched magnetic field that is parallel to the surface that produces any deflection of the electron path along the magnetic "tunnel." Over the magnetic poles this parallel component becomes vanishingly small, thereby allowing the electrons to escape from the field. Thus, ionizing efficiency over the poles is very low, and sputtering rates there are correspondingly small. As a result, only the portion of the total target material in the so-called "race track" region is consumed before the target must be replaced.

The percentage of usable material for a given target design is defined as the target utilization, and the typical utilization of conventional planar magnetron sputtering targets is only about 18 to 25 percent. Since most commonly used target materials are very expensive, either because of the intrinsic value of the material or because of the high purity required, the result is that expensive inventories must be maintained and expensive procedures to recover the scrap must be taken.

A final drawback to conventional cathode assemblies is that the permissible thickness of the targets is limited for given magnet strength and size because the magnets are placed behind the target support, yet a magnetic field of predetermined strength is required in front of the target. This thickness limitation results in a corresponding limitation in sputtering time before the apparatus must be shut down and the target replaced. Since lengthy re-evacuation and decontamination procedures are required after each shutdown, it is highly desirable to extend the continuous sputtering time obtainable from a target for as long as possible, without reducing the rate of deposition.

Accordingly, the principal objects of the present invention are to provide an improved elongated magnetron target, and a cathode assembly incorporating the target, in which the target does not require attachment by bonding, the usable thickness and utilization of target material are substantially increased, the target is economical to fabricate, and the target may be installed and replaced easily and quickly.

These and other objects of the invention are achieved by a sputtering target comprising a set of four straight bars composed of material to be sputter-deposited onto substrates, the set containing a pair of side bars and a pair of end bars, each side bar and each end bar having an inner side, an outer side, a front face, a rear face, and two ends, the four bars of the set being shaped at the ends so that the bars can be assembled as a rectangular frame with the inner sides of each pair of bars facing each other and with the front faces of the four bars providing a rectangular annular sputtering surface.

The thus assembled set of target bars is adapted to be mounted in a cathode assembly including a support means, means for mounting the sputtering target with the rear faces of the bars in electrically and thermally conductive contact with the support means, and magnetic means positioned in the vicinity of the target for providing an arched, closed-loop magnetic field over the front faces of the target bars, wherein said mounting means comprises a magnetically permeable outer pole means fastened to the support means and surrounding the outer sides of said assembled target bars and a magnetically permeable inner pole means extending adjacent to the inner faces of the target bars.

These and other features and advantages of the invention are described in detail below, with reference to the accompanying drawings.

FIG. 7 is an end view in cross section of a fourth embodiment of a target and pole pieces.

FIG. 8 is an end view in cross section of a fifth embodiment of a target and pole pieces.

FIG. 9 is an end view in cross section of the fifth embodiment of FIG. 8 showing the amount of target material remaining at the end of the target's useful life.

FIG. 10 is a perspective view of an alternate way of shaping the ends of the short end bars of the target embodiment of FIG. 8.

FIG. 11 is an end view in cross section of an alternate embodiment of a magnetron cathode assembly that is adapted to use the target embodiments of FIGS. 7 and 8.

Figure 1:
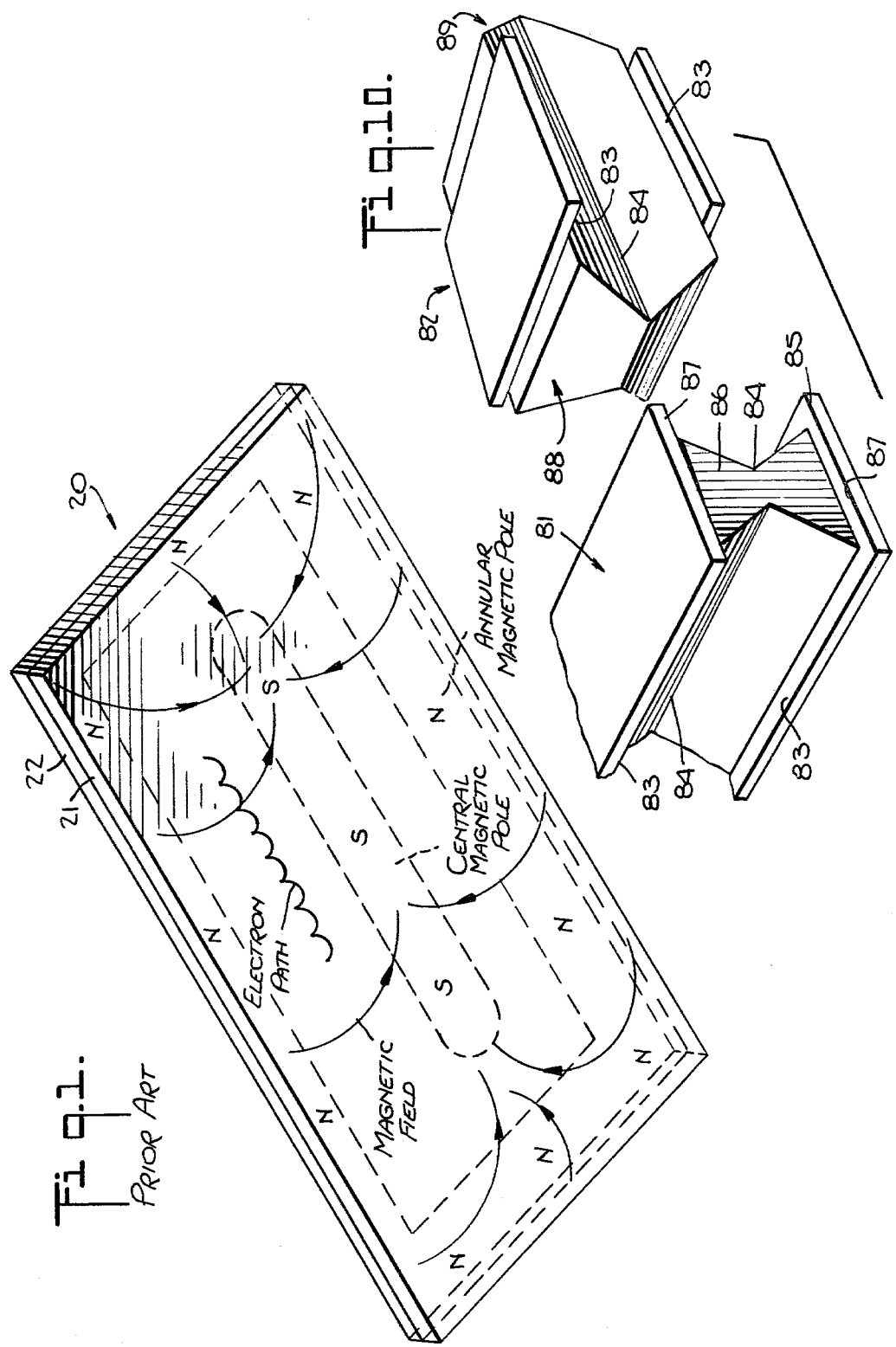
FIG. 1 is a perspective view in schematic form of a conventional planar magnetron target arrangement showing the effect of the closed-loop arched magnetic field.

Before describing the preferred embodiments of the present invention, it will be helpful to discuss briefly the arrangement of a typical conventional planar magnetron cathode assembly. FIG. 1 shows in schematic form a perspective view, looking upward, of a planar magnetron cathode assembly 20 comprising a flat rectangular sputtering target plate 21 attached to a water-cooled support means in the form of a backing plate 22. Although the cathode assembly is pictured with the sputtering surface of the target facing downward, which is the usual position, the target can face in any desired direction within a sputtering chamber, depending upon the design of the equipment. The downward-facing position is preferred so that substrates to be coated can simply be placed on supports underneath the cathode that are either fixed or movable along a line transverse to the longitudinal axis of the target.

Above the backing plate two magnetic poles are arranged: an annular magnetic pole, designated by N, that extends peripherally adjacent to the edge of the backing plate and an elongated central magnetic pole, designated by S, of polarity opposite to that of the annular magnetic pole. Typically, these two poles are produced by two permanent magnets having an annular shape and an elongated bar shape, respectively, and being placed against the upper, or rear, surface of the backing plate. Thus, the magnetic poles are separated from the face of the target by the thicknesses of both the target plate and the backing support means.

The arrangement of an annular pole of one sign and a central bar-shaped pole of the opposite sign (it is immaterial which pole is which sign) creates a magnetic field which emerges from the target face over one pole, bends over, and re-enters the target again over the opposite pole. Thus, a "tunnel-shaped" field is established over the target surface. One further aspect of the field, which can be seen from FIG. 1, is that the tunnel is a closed loop. This loop defines the so-called target race track.

Electrons which are ejected from the target interact with that component of the magnetic field which lies parallel to the target face. This interaction causes the electrons to move in a hopping motion along the direction defined by the race track. This hopping motion confines the electrons to within about one-half cm of the target face, where they remained confined until ionizing collisions direct their path out of the race track. It is this trapping which gives rise to the excellent ionization efficiency of this type of discharge, which in turn is responsible for the high sputtering rates achievable by this method.

FIG. 1 also illustrates the fact that over the magnetic poles, the above-mentioned parallel magnetic field component becomes vanishingly small. Thus, over the magnetic poles, the electrons escape the cathode surface to bombard any substrate placed opposite the cathode. The mean free path of such electrons is in excess of 25 cm at typical magnetron sputtering pressures. Because these electrons escape the cathode, ionization is very inefficient over the magnet poles and the sputtering rates achievable here become vanishingly small. A typical planar magnetron target will therefore sputter along the annular race track region and not sputter elsewhere. This causes a sputtered groove to develop in the target.

Typical planar magnetron sputtering targets will sputter through their thickness, and therefore become unusable, when only 18 to 25 percent of the target material has been sputtered away. Greater utilization can be achieved if the target is purposefully made thicker in the race track region. This target shaping, however, causes the electric fields near the cathode surface to be changed such that the position of most efficient ionization cannot be maintained in a stable location. Thus, the region of highest sputtering rate drifts about, rendering such targets very unpredictable in sputtering performance and utilization efficiency.

A further aspect of the configuration shown in FIG. 1 is that, if a target thickness in excess of about 1 to 1.5 cm is used, then the strength of the magnetic field over the target becomes too small to support the magnetron discharge. This limits target thickness unless magnets of greater field strength are used in the cathode structure. Magnets of greater field strength permit use of a thicker target, but this approach to increasing target life has two serious drawbacks:

(a) Since the target erosion groove in the race track region becomes progressively more cusped as erosion proceeds into the target, the target material utilization suffers. Targets having 2.5 cm thickness, for example, are projected to have a utilization efficiency of less than 10% when used on a typical cathode structure.

(b) The above-mentioned cusping of the erosion groove profile causes the target body to block the path of those sputtered atoms which are ejected from the bottom of the erosion groove. As a result, sputtering rates measured at the substrate site are lowered.

Experiments using thick aluminum targets have shown that initial sputtering rates were reduced by a factor of more than 4, once the erosion groove had penetrated to a depth of about 2 cm into the target.

As mentioned above, any electrons which are generated over the target poles are not trapped by the magnetic field and hence can bombard any substrate which is placed opposite the cathode. Since these electrons have a mean free path in excess of 25 cm, they will bombard the substrate at virtually full cathode energy (approximately 500 eV). Such electrons can give rise to sufficient substrate heating to prevent the growth of hillock-free aluminum films, such films being an important requirement when coating substrates for integrated circuit applications. As a consequence, aluminum metallization normally requires the use of an electron capture shield, consisting of a physical barrier maintained at anode potential which is placed over the pole regions of the cathode, thereby preventing these electrons from reaching the substrate.

Figure 2:
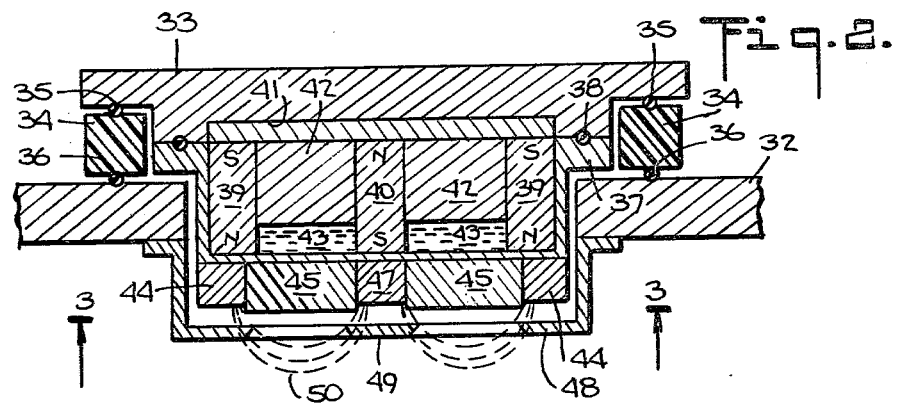
FIG. 2 is an end view in cross section of a magnetron cathode assembly, according to the invention, shown mounted through an opening in a wall of a sputtering chamber.
Figure 3:
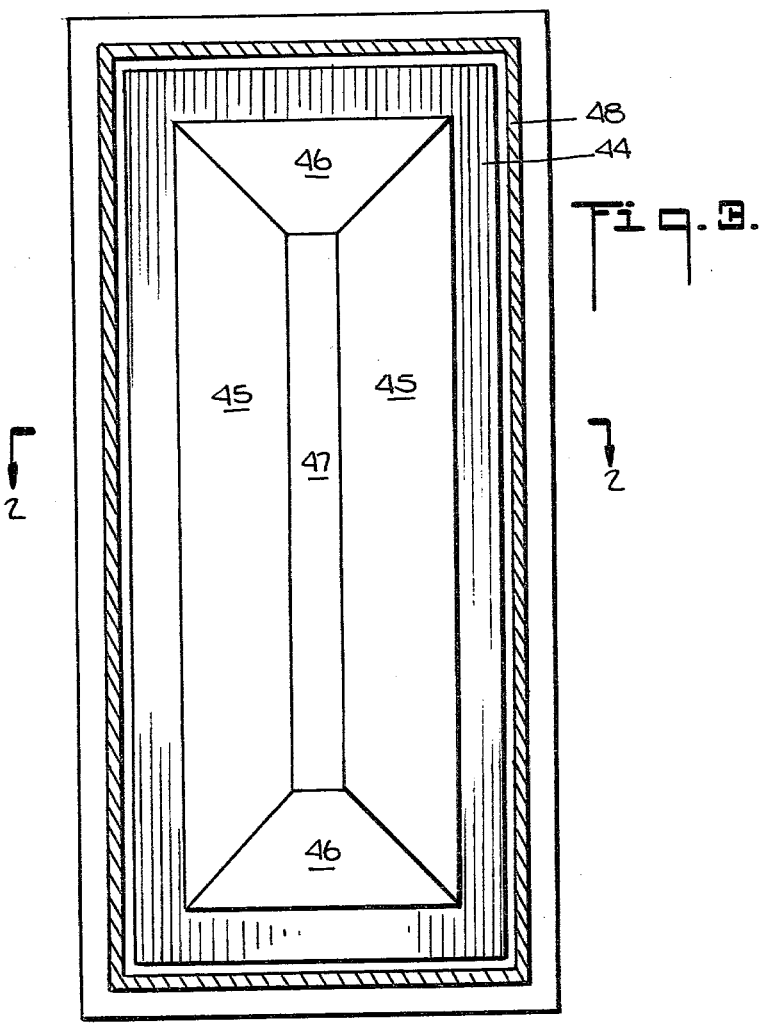
FIG. 3 is a plan view of the cathode assembly of FIG. 2 taken along line 3—3.

With reference to FIGS. 2 and 3, a cathode assembly 31 according to the present invention is shown mounted in an opening through top wall 32 of an evacuable sputtering chamber. Assembly 31 includes a cover plate 33 which is mounted against the exterior surface of wall 32 by means of a stand-off insulator ring 34 and elastomeric vacuum sealing rings 35 and 36. These high-vacuum seal rings permit the chamber to be evacuated to a pressure of less than $1 \times 10^{-6}$ Torr before introducing a sputtering gas (normally argon) at a sputtering pressure of about 14 microns.

A target support means or backing plate 37, in the form of a flanged rectangular dish, is made of a nonmagnetic material having good heat transfer characteristics, such as copper, and is mounted against the lower face of cover plate 33 by means of an elastomeric seal 38. Sealed inside the copper backing plate are a rectangular annular permanent magnet 39 and a central permanent bar magnet 40 positioned against a magnetic keeper plate 41 that fits within a shallow cutout region of cover plate 33. Bar magnet 40 is positioned in spaced relation, both at its sides and ends, to annular magnet 39 by spacer blocks 42. There is a space 43 between the undersides of blocks 42 and the bottom of the copper supporting means for circulation of cooling water introduced and exhausted through attachments (not shown) at the ends of the support 37.

The principal characterizing feature of the present invention lies in the form of the target and the arrangement for mounting the target on the face of the water-cooled backing plate. Instead of a flat rectangular target plate, congruent with and affixed to the face of the backing plate, a rectangular frame-like pole piece 44, consisting of a permeable magnetic material such as soft iron or permalloy, is attached to the underside of the copper support means by brazing or other suitable procedure. Inside the area defined by the ring shaped pole piece is a target set comprising four prismatic bars: two identical long side bars 45 and two identical short end bars 46. The side bars and end bars of this embodiment of the target are formed with mitered ends, so that the four bars assemble together to form a frame that fits snugly within the recess provided by pole piece 44. Within the frame of the target bars is an additional pole piece in the form of a long bar 47, which also is brazed or otherwise bonded to the undersurface of the copper support means 37.

It is apparent that by use of magnetic pole pieces 44 and 47, the magnetic poles are effectively extended downward from the lower faces of the corresponding magnets 39 and 40 to be adjacent to the sputtering face of the target, so that a strong magnetic cross field below the sputtering face is obtained regardless of the target thickness. At the same time, target material is confined to the "race track" region of most efficient sputtering, thereby increasing target utilization to a considerable degree.

The dimensions of the target bars 45 and 46 and also of the pole pieces 44 and 47 are maintained to close tolerances so that the target bars fit snugly between the pole pieces. In this way, the target bars can be installed in the cathode assembly without any adhesive material and will be held in place merely by the close fit between the target bars and the pole pieces. As soon as sputtering voltage is applied between the cathode and the sputtering chamber by a high voltage source (not shown), the cathode assembly will begin to heat up, and the target bars will become more firmly clamped by the pole pieces by reason of thermal expansion. At the same time, the increased clamping pressure improves the transfer of heat from the target bars through the pole pieces to the cooling water circulating through space 43 so that the target material will not overheat. Finally, since the target bars are not bonded to the backing plate, they can be removed when they have become eroded to the point of replacement, without having to send the entire cathode assembly back to the manufacturer.

Because sputtering occurring from the iron pole pieces could contaminate the layer of target material deposited on substrates (not shown) positioned below the cathode assembly, a metallic, water-cooled electron capture shield 48 maintained at or near anode potential, covers the annular pole piece, and a separate water-cooled electron capture shield 49 covers the central pole piece, the electron capture shields thereby allowing sputtering to occur from the target material only. The central shield is suspended from two hollow supports (not shown for simplicity) one at each end, that extend downward in insulating sleeves through the backing plate, center bar magnet 40 and center pole piece 47 to supply and exhaust cooling liquid.

These shields serve two functions. First, they suppress any gas discharge over the magnet poles. In this way, sputtering of the pole-piece material is avoided, thus preventing contamination of the sputtered film. Secondly, any discharge which forms over the magnet poles will produce cathode electrons which will not be trapped by the magnetic field. These electrons can subsequently bombard, and therefore heat, any substrate placed opposite the cathode. The electron capture shields prevent escape of such electrons and thus maintain lower substrate temperatures during deposition. Low substrate temperatures are of considerable importance with the deposition of aluminum and its alloys—a very important class of materials used in the manufacture of integrated circuits.

The magnetic path between the permanent magnets contained within the copper mounting fixture and the pole pieces on the lower face of the fixture produces a magnetic field 50 in the form of an arched closed loop extending below the faces of the target bars. This closed magnetic loop traps electrons and increases ionization within the region, an essential requirement for optimum magnetron sputtering, as described above.

The target embodiment of FIGS. 2 and 3 has the advantage that the cross-sectional shape of the target bars is a simple rectangle, thus making the bars relatively easy and inexpensive to fabricate, bearing in mind the need for close dimensional tolerances. This advantage is offset by the fact that the electron capture shield must slightly overlap the edges of the target bars to avoid sputtering from the magnet pole pieces adjacent to the edges of the target bars and consequent contamination of the film of sputter-deposited target material on the substrate below. Since the aperture of the capture shield is narrower than the width of the bars, this reduces the maximum utilization of target material possible with this configuration.

Figure 4:
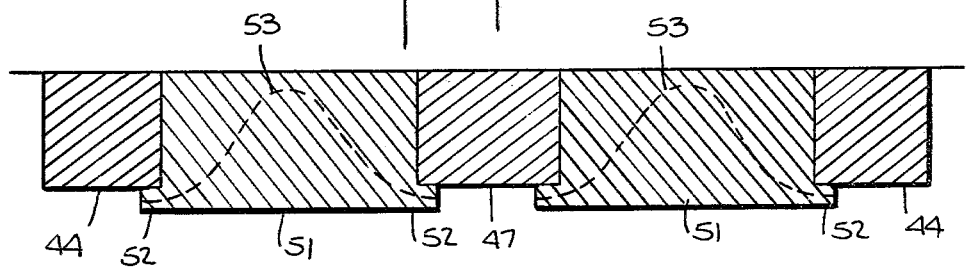
FIG. 4 is an end view in cross section of one embodiment of a target and pole pieces of a cathode assembly according to the invention.

FIG. 4 shows an alternate embodiment of target bars which allows a substantially wider aperture for the electron capture shield at the expense of only a slightly more complex target bar cross section. In FIG. 4 and the succeeding FIGS. 5–9, only the longitudinal target side bars and corresponding pole pieces are shown, for simplicity, and elements identical to elements in FIGS. 2 and 3 are identified with the same reference numerals.

In FIG. 4, for example, the frame-shaped annular pole piece 44 and the central bar of the pole piece 47 are identical to the pole pieces in FIGS. 2 and 3. In this embodiment, however, target bars 51 are provided with overhanging flanged portions 52. These flanged portions cover the adjacent edges of the pole pieces to protect these edges against sputtering and consequent contamination of the film deposited on the substrates, thereby allowing a wider aperture for the electron capture shield. Since very little sputtering occurs at the edges of the bars, the flange portions can be thin compared with the thickness of the main portion of the bars without limiting the permissible depth of sputtering. This is clear from the dashed lines 53 which indicate the final sputtered profile of the spent targets.

It will be understood that the target end bars in the embodiment of FIG. 4 preferably have the same cross section as the side bars; in fact, this is true for each of the illustrated embodiments. This is advantageous for a reason to be discussed below in connection with the more complex cross sections of the target bars in FIGS. 7 and 8.

Figure 5:
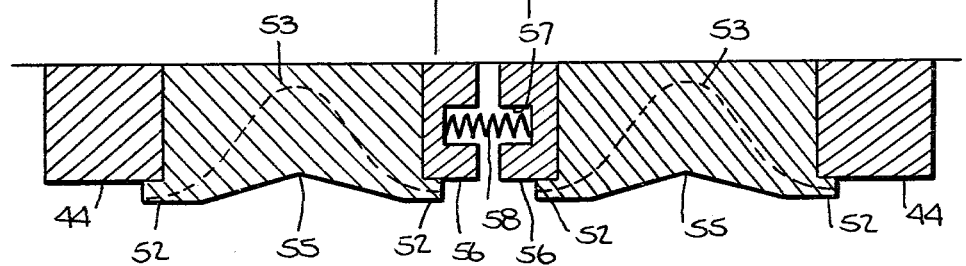
FIG. 5 is an end view in cross section of another embodiment of a target and pole pieces.

FIG. 5 shows still another embodiment of the target bars and the center pole piece. It has been found that initial sputtering from a completely flat target face tends to be non-uniform because of the effect of the arched closed-loop magnetic field. As sputtering progresses, an eroded valley is formed on the target surface in the region of the closed-loop magnetic field. The deposition of material sputtered from the target tends to become more uniform as the valley shape becomes stabilized. In FIG. 5, target bars 54 are provided with a preformed surface V-groove 55 corresponding to the valley shape attained after sputtering has progressed for a certain time. With this shape, uniform sputtering deposition is obtained from the start, with only a small decrease in material available for sputtering from the targets. As shown by dashed lines 53, the sputtered profile of the targets 54 of this embodiment, when spent, is essentially the same as for the target bars of FIG. 4.

The embodiment of FIG. 5 also includes an alternative form of the central pole piece. The need to maintain close tolerances in the lateral dimensions of the target bars and pole pieces to achieve the fit needed to hold the bars in place increases the cost of these components. In FIG. 5, the central pole piece comprises two narrow bars 56 which are identical. The bars have a series of holes 57 drilled in one face, into which means are inserted means for urging the bars apart, such as springs 58. In this way, the target side bars 54 are clamped against the outside pole pieces 44 without the need for close dimensional tolerances.

Figure 6:
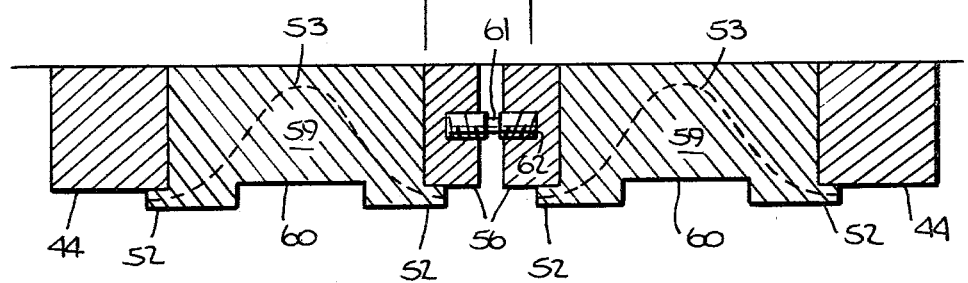
FIG. 6 is an end view in cross section of a third embodiment of a target and pole pieces.

FIG. 6 illustrates still another alternative shape for the target bars, in which target bars 59 have a flat groove 60 instead of a V-groove. This embodiment also results in the same spent target profile 53 as the embodiments of FIGS. 4 and 5. In FIG. 6, the center pole piece elements 56 are urged apart by adjustable screw members 61 inserted into threaded holes 62 to achieve the same clamping effect as the springs of the embodiment shown in FIG. 5.

The target bar embodiments of FIGS. 2–6 described up to this point share the advantage that they can be inserted into and removed from the cathode assembly without detaching the pole pieces from the backing plate. On the other hand, they also share the disadvantage that maximum target material utilization is still below 50 percent, as is apparent from the spent target profiles of FIGS. 4–6. Furthermore, the maximum target thickness is limited to about 1 to 1.5 cm because the previously-mentioned increased cusping of the sputtered groove profile with depth begins to sharply limit the deposition rate beyond this depth range. In addition, the lateral clamping type of center pole pieces of FIGS. 5 and 6, although they permit looser dimensional tolerances for the target bars, have various practical disadvantages, such as tending to loosen up over time and repeated sputtering cycles.

The alternative embodiments of FIGS. 7 and 8 overcome these disadvantages while still retaining the important advantage of simple, on-site, target installation and replacement. This is achieved by the simple expedient of forming the target bars with lips or flanges 52 on both faces, as shown in FIGS. 7 and 8. In FIG. 7, flanges 52 are provided on an otherwise rectangular target bar 66. This arrangement has two advantages. First, it permits positive vertical clamping of the upper flange of the target bars in the cathode assembly by using bolts 67 in the respective annular outer pole piece 68 and central pole piece 69. Secondly, since the cross section of the target bars is symmetrical about a midplane parallel to their faces, their thickness can be doubled and the bars can be inverted, after the first exposed face has been eroded to a maximum practical depth, for further sputtering from the opposite face. In this way, the amount of material that can be sputtered from a set of bars is approximately doubled.

From inspection of FIG. 7, it is clear that vertical clamping by the pole pieces against the upper flanges of the bars not only locks the bars securely in the cathode assembly and provides improved electrical and thermal contact between the bars and the backing plate but also permits substantial lateral clearance to allow for differential thermal expansion of the bars relative to the pole pieces. Inspection of FIG. 7 shows further, however, that the spent bars 66 still have a substantial amount of unusable material, as indicated by the sputtered profile lines 70 and 71.

FIG. 8 shows an alternative arrangement similar to FIG. 7 but in which target bars 72 have side V-grooves 73, giving them an hourglass shape in cross section. From an inspection of FIG. 9, the cross sectional shape of these target bars after maximum sputtering from both faces, as shown by the sputtered contours 75 and 76, it is clear that the cross section of the target bar embodiment of FIG. 8 results in the absolute minimum amount of waste material remaining after sputtering of the target bars from both faces; that is, it provides maximum utilization of the target bars. In fact, preliminary tests indicate that utilization of target material attainable with bars of this shape is approximately 65 percent, from two to three times greater than the utilization attainable with rectangular flat target plates in conventional planar magnetron cathode assemblies.

For certain sputtering processes, the target bars may be required to be made of very expensive materials, such as platinum or gold. In order to reduce the amount of such material required for a target assembly, the target bar cross section may be formed as a composite of two or more materials, joined by mechanical or other suitable means, with the expensive material on one side of the midplane and a suitable inexpensive base metal on the other side of the midplane. For example, in FIG. 8 the upper half of each bar 72 may be made of copper and the lower half may be made of gold or platinum. In such a configuration, only one face of the target bar would be sputtered, but the improved utilization of sputtered material provided by the target configuration of this invention would be retained.

Although the target bar embodiment of FIG. 8 is formed with flat faces, 74, these faces can be made with shallow V-grooves in the manner of FIG. 5, or with flat grooves in the manner of FIG. 6, if desired, to improve the uniformity of deposition coating over the life of the set of target bars. This is true also, of course, with any of the other illustrated target bar embodiments. In the case of a composite bar, such as the copper-platinum bar described above, the face of the copper side may be left flat for optimum heat transfer and the platinum side may be provided with a shallow groove.

One apparent drawback to the flanged hourglass cross sectional shape of the target bar embodiment of FIG. 8 is that one would expect it to be difficult and costly to manufacture, particularly in comparison with the plain rectangular cross section of the bars in FIG. 1. In fact, however, this is not the case, at least for most sputtering target materials, which can be readily extruded. The extrusion process is ideally suited to producing long bars of constant cross section, regardless of the complexity of the section shape. The long extruded bars can then be cut to length, so that the only machining operations are those required to finish the ends. As a result, the scrap produced in manufacturing a set of target bars is very low.

The ends of each FIG. 8 target bar can be bevelled to provide mitered corners, as in FIG. 3. Although this type of corner may be simple to machine, it presents practical difficulties. If the clearance between adjacent side and end bars is too little, differential thermal expansion may cause the bars to warp. On the other hand, if the clearance is too great, sputtering of backing plate material through the gap or uneven sputtering deposition may result. An alternative design, shown in FIG. 10, avoids both of these problems.

In FIG. 10, a short section at one end of a target side bar 81, having the FIG. 8 cross section, is shown in an exploded assembly relation to a target end bar 82, having the same cross sectional shape. Each side of bars 81 and 82 has a flanged upper and lower lip 83 and a symmetrical V-groove 84. The end 85 of side bar 81 is cut off square, and then a notch 86 is machined to provide flanged upper and lower lips 87. The other end (not shown) is similarly machined. One end 88 of target end bar 82 is machined to mate with the flanged and grooved side of bar 81, and the other end 89 is machined identically to mate with the other side target bar (not shown). When the four target bars are installed in a cathode assembly, the two end bars will then nest against the respective sides of the side bars.

With the arrangement of FIG. 10, a substantial expansion gap can be provided between the ends of the end bars and sides of the adjacent side bars without creating a direct line of sight to the target support, even after a full depth groove has been sputtered in each face of each bar. As in the case with complex cross sectional shapes for the bars, machining the ends of the end bars in this configuration need not be an excessively costly or time consuming operation. Since the shape is the same for target bars of all materials intended for use in a given target assembly, the initial cost of a specially profiled milling cutter or of establishing a program for a computerized machine tool can be spread over a large number of targets. Since no tight machining tolerances are necessary for this embodiment, the overall machining costs can be substantially less than for the bevelled edge design of FIG. 3. It will be appreciated also that, if desired, the end bars could be extended to outer edges of the side bars, cut off square and notched, and the ends of the side bars machined to nest against the adjacent sides of the end bars.

Figure 12:
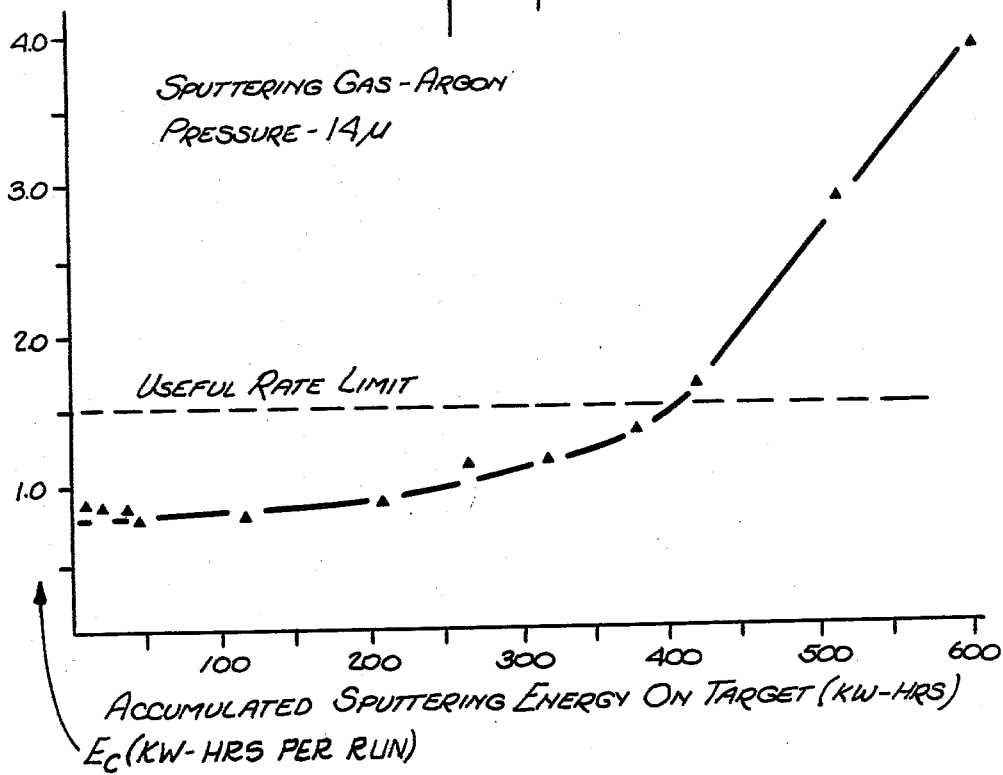
FIG. 12 is a plot of cathode film production rate versus accumulated sputtering energy for a target in the cathode assembly of FIG. 11.

Before going on to describe the preferred alternative cathode assembly of FIGS. 11 and 12, it should be mentioned that the annular pole piece of FIGS. 7 and 8 is made preferably in the form of four bars; two identical side pole pieces 68 or 77 and two identical end pole pieces (not shown). This arrangement is much simpler to manufacture than a one-piece annular pole piece and facilitates installation and removal of the target bars.

It should be noted also that the side pole pieces 77 and central pole piece 78 of FIGS. 8 and 9 are of slightly different design than the corresponding pole pieces 68 and 69 of FIG. 6. Each pole piece 77 and 78 (as well as the end pole pieces that are not shown in these FIGS.) has an insert 79 of nonmagnetic material along its entire length facing the adjacent side of the respective target bar. The purpose of these inserts is to shape the magnetic field to increase the strength of the arched field in front of the surface of the target bars and to reduce the tendency of the magnetic field to short circuit between the poles.

Turning now to FIG. 11, this drawing shows an alternative cathode assembly 101 that is specially adapted for use with the symmetrically flanged target bars of FIGS. 7 and 8. The arrangement of the magnet side of the assembly is similar to that of FIG. 1, but simplified. As in FIG. 1, the cathode assembly 101 is mounted in an opening through the top wall 102 of a sputtering chamber. A support means or backing plate 103 is mounted on top wall 102 by means of a stand-off insulator 104 and vacuum seal rings 105 and 106. The backing plate preferably is made of copper and contains passages 107 and 108 for circulation of liquid coolant that is supplied and exhausted through tubes (not shown) to prevent excessive heating of the target, as in conventional cathode assemblies. The upper face of the copper backing plate has an annular groove 109 near its periphery. A permanent annular magnet 110 fits into this groove, with one pole (North polarity in the drawing) placed against the bottom of the groove. The shape of the groove in plan is an elongated rectangle, a shape which allows the use of an annular magnet assembled from four bar magnets.

A central groove 111 accepts a mating bar magnet 112, installed so that a pole (South polarity in the drawing) of polarity opposite to the polarity of the annular magnet is placed against the bottom of the groove. A magnetic keeper plate 113 is secured to the upper, opposite, poles of the annular magnet 110 and central, bar magnet 112 to complete the magnetic circuit between them.

A rectangular pole piece mounting frame 114, consisting of a permeable magnetic material such as soft iron or permalloy, is attached to the underside of the copper backing plate by brazing or other suitable means. Inside the area defined by mounting frame 114 is a target set of four prismatic bars, two identical long side bars 115 and two identical short end bars 116. The side and end bars of the target have their ends formed so that the four bars mate together to form a rectangular annular target that fits within the recess provided by pole piece mounting frame 114. Within the annular target is an additional pole piece mounting member in the form of a long magnetically permeable bar 117, which also is brazed or otherwise bonded to the undersurface of the copper backing plate 103.

The upper inner flanges of the side target bars 115 and of the end target bars 116 are clamped against the face of backing plate 103 by a center pole piece 118, which is fastened by cap screws 119 to the mounting member 117. If the target bar material is weak or brittle, screws 119 may be equipped with springs, not shown, to limit the amount of clamping force applied to the target bar flanges. The upper outer flanges of bars 115 and 116 are similarly clamped to the face of the backing plate by side pole pieces 120 and corresponding end pole pieces (not shown) which are bolted to the annular mounting frame 114. All of the pole pieces are made of soft iron or other permeable magnetic material. Preferably, however, the pole pieces have nonmagnetic strips 121 inset along their sides facing the target bars to reduce the tendency of the magnetic to short-circuit through the target bars and to direct the magnetic flux toward the lower facing edges of the pole pieces to form an arched, magnetic field 122 that extends in a closed loop under pregrooved sputtering faces 123 of the side target bars 115 and the corresponding sputtering faces (not shown) of the end target bars 116. The field can be further advantageously shaped by bevelling the lower outer edges 124 of the side pole pieces and end pole pieces (not shown) and providing a trough 125 with bevelled sides in the lower face of center pole piece 118.

As in the embodiment of FIG. 2, this embodiment also includes an outer electron capture shield 126 and a separate central capture shield 127 to prevent sputtering from the outer and center pole pieces, respectively. Even though the flanged target bars of this design substantially reduce the amount of sputtering that occurs from the pole pieces, it has been found that electron capture shields are still needed to prevent any residual sputtering from non-target parts of the assembly. Particularly when sputtering high purity aluminum, the shields are essential to the preparation of flat, hillock-free films required for integrated circuits.

The central shield is supported by a hollow post 128 at either end, the post extending inside insulating bushings (not shown) through the cathode assembly and being connected above the assembly to a circulating liquid coolant system (not shown). A coolant tube 129, brazed to the upper surface of the shield 127 extends between the support posts to help prevent overheating and warping of the shield during sputtering operations. The outer shield is removably mounted on the undersurface of the top 102 of the sputtering chamber by any suitable means, such as machine screws 130.

Although the illustrated example of outer shield 126 is in the form of a single-piece flanged, rectangular, open-bottom container, the shield may be constructed in alternative w \ys. For example, the sides and ends of the shield structure could be made as a separate piece or pieces, and the bottom part of the shield could be bolted to the sides and ends, thereby reducing the amount of structure that has to be disassembled when reversing or replacing the target bars.

Assembly and disassembly of the embodiment of FIG. 11 can be performed simply and quickly by any mechanic using hand tools. For example, when the sputtering faces of target bars 115 and 116 have been eroded to the profile indicated by dashed lines 131, the deposition rate will be reduced to the point where the bars should be turned over. After sputtering has been stopped and the sputtering chamber opened, the outer shield 126 (or the bottom part of it, if the shield is made in several separable pieces) is removed to provide access to the pole pieces. Next the side pole pieces 120 are unbolted and removed. The bolts on the end pole pieces (not shown) and the center pole piece 118 need only to be loosened enough to release the side target bars and then slide out the end target bars 115 and 116, respectively. The target bars are either turned over to expose a fresh sputtering surface and slipped back in position or replaced by new bars if both sides have been used. The side pole pieces and a cleaned outer electron capture shield are then remounted, the chamber closed and re-evacuated, and sputtering is ready to start again, after an initial sputter-cleaning period. The replacement procedure itself takes only from one-half to one hour.

The performance characteristics of a cathode assembly according to the embodiment of FIG. 11 can be illustrated by means of the following example.

EXAMPLE

A cathode assembly comprising aluminum target bars having a cross-sectional shape as shown in FIG. 11 and the following approximate dimensions:
Side bars: 4.0 cm wide×2.7 cm deep×38 cm long
End bars: 4.0 cm wide×2.7 cm deep×6.3 cm long,
was installed in a Model 900 Sputtering Machine, manufactured by Materials Research Corp., Orangeburg, New York, and the system was operated in the D.C. magnetron mode at 10 kw applied power. Target temperature was estimated at about 150° C. by observing thermal expansion of the bars. No signs of target melting were observed throughout the target life, indicating that the heat transfer rate to the water cooled backing plate through the clamped flanges was fully adequate.

Average sputtering rates were determined by measuring the total energy (in KW hours) required to coat a pallet loaded with 3-inch (7.6 cm) diameter wafers with a 1 micron coating of aluminum. This energy, termed $E_c$, was calculated by the equation:

$$E_c = P \times \frac{L/60}{R}$$

where
P=power applied to cathode (KW-Hr)
L=pallet scanning length (18 inches)
R=scanning rate (inches/minute)

Two rate retarding mechanisms were observed. The first of these was the previously mentioned retardation associated with a deep sputtered erosion groove. The second rate retarding mechanism was associated with sputter coating of the electron capture shield which caused a reduction in its sputtering aperture.

The significance of the rate retarding effect of a deep erosion groove is seen in FIG. 12. Here the rate was monitored versus the total accumulated sputtering energy expended on the target bars. The electron capture shield was carefully cleaned before each rate determination to eliminate that variable. FIG. 12 shows that rate deterioration is relatively insignificant up to an accumulated sputtering energy of approximately 400 kilowatt hours; thereafter, sputtering rate decreases rapidly. The 400 kilowatt hours of total sputtering energy resulted in an erosion groove depth of approximately 1.6 cm. Thus, the target bars of this design preferably should be turned over after about 325 kilowatt hours, corresponding to an erosion groove depth of approximately 1.3 cm.

Figure 13:
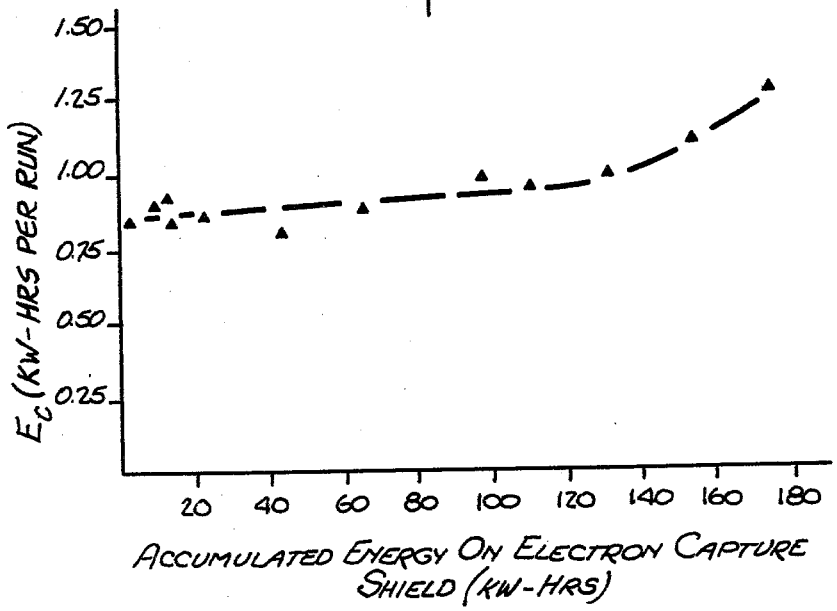
FIG. 13 is a plot of cathode film production rate versus accumulated sputtering energy on the electron capture shield of a cathode assembly as in FIG. 11.

The significance of the rate retarding effect produce by sputter coating of the electron capture shield is shown in FIG. 13. This is a plot of $E_c$ versus total accumulated sputtered energy. It is seen that after a time of 100–125 KW hours on the target, the rate has deteriorated by approximately 15%. Thus, it is recommended that the electron capture shield be cleaned after such time intervals. As previously described, the electron capture shield has been designed for simple removal to facilitate such cleaning. It is further recommended that two such shields be used, so that a clean shield is always available for insertion. Under these circumstances, the total time to exchange shields is only 15 minutes. The pumping time necessary to achieve a vacuum of $5 \times 10^{-7}$ torr is typically 2 to 3 hours after such a shield change. Thus, shield changes should be scheduled at the end of the production day.

A set of target bars will normally permit a total accumulated sputtering energy of 625 to 650 kilowatt hours. Since a typical value of $E_c$ is approximately 0.95 kilowatt hours, a total of up to 684 pallet runs will be accomplished within the life of a set of target bars. Thus, a total of approximately 10,000 wafers of 3-inch (7.6 cm) diameter can be coated with 1 micron of aluminum using a single set of target bars.

After approximately 100–125 production runs (assuming 1 micron coatings) the electron capture shield requires cleaning. This is repeated after 200–250 production runs. After 300–350 production runs, the electron capture shield is again cleaned, and the target bars are turned over. The electron capture shield is then again cleaned as per the above schedule until the target bars are spent.

Using the above recommended conditions of sputtering pressure, electron capture shield cleaning and target changeover, a minimum scanning rate of 2 inches/minute (5 cm/min.) yielded as 1 micron thick coating on a wafer-loaded pallet. This implies a minimum production rate of 5 production runs per hour, or a wafer throughput of 80 wafers of 7.6 cm diameter per hour.

The resulting 1 micron films were analyzed for possible iron pole piece contamination using SIMS (Secondary Ion Mass Spectroscopy). This method is suitable for iron detection in the low ppm range. The system was calibrated using as a reference standard a piece of high purity aluminum having an iron content of 0.71 ppm by weight, as determined by mass spectrographic analysis. The analytical results demonstrated that the iron content values of films prepared from the cathode assembly of the example were within the experimental scatter of the measured values of the standard. It was noted, however, that films prepared without the electron capture shield showed an iron contamination of 200 ppm, clearly demonstrating that the shield is necessary to prevent film contamination.

Microstructure examination of 1 micron films deposited onto 2 inches (5 cm) diameter oxidized silicon wafers was carried out using SEM methods. The SEM results indicated that the films were hillock-free, exhibiting a grain size of 0.2 to 0.7 microns. Visually, such films all exhibited the highly reflective appearance typical of hillock-free films.

Finally, an important characteristic for a thin film deposition system used for semiconductor applications is that it produce good step coverage. This is a feature of conventional planar magnetrons. To test the performance of the cathode assembly of the example, it was used to coat silicon oxide wafers having 0.5 micron steps, the steps being oriented both parallel to and transverse to the direction of pallet movement. In all cases, the ratio of film thickness from the side of the step to the top of the step was approximately 0.9 to 1.0. In addition, no "mouse holes" or film fissures were observed.

The tests reported in the foregoing example demonstrate that the cathode assembly of the present invention can yield highly reflective, hillock-free aluminum films. The films are contamination-free and in every way suitable for silicon wafer metallization. Furthermore, the excellent step coverage which is typical for planar magnetrons is also evident in films prepared from the present cathode. Thus, it can be concluded that films prepared from this cathode retain all the technological advantages observed in films prepared from planar targets.

From the economic viewpoint, the cathode assembly of the invention demonstrates clear superiority. The number of production runs achievable from a target set is increased from 120 to in excess of 600.

Preliminary measurements of target utilization indicate a utilization of approximately 65% compared with planar target utilizations of only about 18 to 25%. Finally, this improved cathode design has demonstrated the ability to handle 10 KW of applied power, thereby yielding production rates comparable to standard planar targets. It is clear therefore that the need for target bonding has been eliminated by this design, thereby permitting simple replacement of spent targets in the field.

We claim:

1. A cathode assembly for use in a magnetron sputtering apparatus having an evacuable chamber, the cathode assembly being adapted to be mounted in the chamber and including a sputtering target, a support means for the sputtering target, means for mounting the sputtering target in electrically and thermally conductive contact with the support means, and magnetic means positioned in the vicinity of the target for providing an arched, closed-loop magnetic field over a sputtering surface of the target, the improvement wherein the sputtering target comprises:

a set of four straight bars composed at least partly of material to be sputter-deposited onto substrates, the set containing a pair of side bars and a pair of end bars, each side bar and each end bar having an inner side, an outer side, a front face, a rear face, and two ends, the four bars of the set being shaped at the ends so that the bars can be assembled as a rectangular frame with the inner sides of each pair of bars facing each other and with the front faces of the four bars providing a rectangular annular sputtering surface, the thus assembled set of target bars being adapted to be held by said mounting means with the rear faces of said bars in electrically and thermally conductive contact with the support means of said cathode assembly.

2. A cathode assembly according to claim 1 wherein each target bar has a constant cross section.

3. A cathode assembly according to claim 2 wherein all of the target bars have identical cross sections.

4. A cathode assembly according to claim 1 wherein the target side bars are identical, and the target end bars are identical.

5. A cathode assembly according to claim 1 wherein the four target bars have rectangular cross sections and are adapted to be held by frictional engagement between said mounting means and the inner and outer sides of said bars.

6. A cathode assembly according to claim 1 or 5 wherein the ends of said side bars and end bars are mitered to permit assembly of said bars as a rectangular frame.

7. A cathode assembly according to claim 1 or 5 wherein at least the side target bars are provided with overhanging flanged portions forming lateral extensions of the front faces of said bars.

8. A cathode assembly according to claim 1 wherein the cross sections of the target bars are symmetrical about a plane midway between said front and rear faces.

9. A cathode assembly according to claim 1 wherein the cross sections of the target bars are symmetrical about both a plane midway between said front and rear faces and a plane midway between said inner and outer sides.

10. A sputtering target for a magnetron sputtering apparatus, the target comprising:

a set of four straight bars composed at least partly of material to be sputter-deposited onto substrates, the set containing a pair of side bars and a pair of end bars, each side bar and each end bar having an inner side, an outer side, a front face, a rear face, and two ends, the four bars of the set each having a centrally positioned longitudinal groove in the front face thereof and being shaped at the ends so that the bars can be assembled as a rectangular frame with the inner sides of each pair of bars facing each other and with the front faces of the four bars providing a rectangular annular sputtering surface, and at least the side target bars being provided with flanged portions forming lateral extensions of the front faces of said bars.

11. A sputtering target according to claim 10 wherein each target bar comprises a front portion and a rear portion, the front portion being composed of a material to be sputter-deposited on the rear portion being composed of a base metal.

12. A sputtering target according to claim 10 wherein the longitudinal groove has a V-shaped cross section.

13. A sputter target according to claim 10 wherein the longitudinal groove has a rectangular cross section.

14. A sputtering target for a magnetron sputtering apparatus, the target comprising a set of four straight bars composed at least partly of material to be sputter-deposited onto substrates, the set containing a pair of side bars and a pair of end bars, each side bar and each end bar having an inner side, an outer side, a front face, a rear face, and two ends, the four bars of the set being shaped at the ends so that the bars can be assembled as a rectangular frame with the inner sides of each pair of bars facing each other and with the front faces of the four bars providing a rectangular annular sputtering surface, and wherein each target bar has an hourglass cross section and is provided with overhanging flanged portions adjacent both the front and rear faces.

15. A sputtering target according to claim 14 wherein a midplane between the front and rear faces of each target bar divides the bar into a front portion and a rear portion, the front portion being composed of a material to be sputter-deposited, and the rear portion being composed of a non-sputtered base material.

16. A sputtering target according to claim 14 wherein the ends of one pair of said set of target bars are profiled to fit against the inner sides of the other pair of said set to permit assembly of said bars as a rectangular frame.

17. A cathode assembly for use in a magnetron sputtering apparatus having an evacuable chamber, the cathode assembly being adapted to be mounted in the chamber and including a sputtering target, a support means for the sputtering target, means for mounting the sputtering target in electrically and thermally conductive contact with the support means, and magnetic means positioned in the vicinity of the mounting means for providing an arched closed-loop magnetic field over the sputtering surface of the target, wherein the improvement comprises:
   said sputtering target being in the form of a rectangular annular frame and
   said mounting means including a magnetically permeable rectangular, frame-like, annular outer pole means fastened to the support means and an inner pole means having sides spaced from the opposing inner sides of the frame-like outer pole means to provide a rectangular annular channel for receiving said sputtering target.

18. A cathode assembly according to claim 17 wherein said sputtering target has a rear face making electrically and thermally conductive contact with said support means, a front face forming a rectangular annular sputtering surface, and inner and outer sides, said inner and outer pole means engaging said inner and outer sides, respectively, for holding the target in the cathode assembly.

19. A cathode assembly according to claim 18 wherein the inner and outer pole means frictionally engage the respective inner and outer sides of the target.

20. A cathode assembly according to claim 19 wherein the inner pole means comprises two members and means for urging the two members apart into frictional engagement with the opposed inner sides of the target.

21. A cathode assembly according to claim 20 wherein the means for urging apart the two members of the inner pole means comprises spring means positioned between the two members.

22. A cathode assembly according to claim 20 wherein the means for urging apart the two members of the inner pole means comprises screw means threadably engaged in at least one of said two members.

23. A cathode assembly according to claim 17 wherein the outer poles means comprises a pair of parallel, spaced apart, side pole members, a pair of parallel, spaced apart, end pole members, and mounting bolts for detachably fastening the side pole members and end pole members to the support means.

24. A cathode assembly according to claim 23 wherein said side pole members include means on the inward facing sides thereof spaced from the support means and adapted to bear against overhanging flanged portions extending laterally from the opposing sides of a target mounted in the annular channel for clamping the rear face of the target into electrically and thermally conductive contact with the support means.

25. A cathode assembly according to claim 24 wherein said clamping means comprises nonmagnetic members mounted on the inward facing sides of side pole members.

26. A cathode assembly according to claim 17 wherein the front outer edge of said outer pole means is bevelled, thereby concentrated the arched magnetic field adjacent to the annular channel.

* * * * *